(12) United States Patent
Kwon

(10) Patent No.: US 11,592,473 B2
(45) Date of Patent: *Feb. 28, 2023

(54) METHOD OF PREPARING COMPOSITE MATERIAL FOR SEMICONDUCTOR TEST SOCKET THAT IS HIGHLY HEAT-DISSIPATIVE AND DURABLE, AND COMPOSITE MATERIAL PREPARED THEREBY

(71) Applicant: PUKYONG NATIONAL UNIVERSITY INDUSTRY—UNIVERSITY COOPERATION FOUNDATION, Busan (KR)

(72) Inventor: Hansang Kwon, Busan (KR)

(73) Assignee: Pukyong National University Industry-University Cooperation Foundation, Busan (KR)

( * ) Notice: Subject to any disclaimer, the term of this patent is extended or adjusted under 35 U.S.C. 154(b) by 317 days.

This patent is subject to a terminal disclaimer.

(21) Appl. No.: 16/909,167

(22) Filed: Jun. 23, 2020

(65) Prior Publication Data

US 2021/0325449 A1 Oct. 21, 2021

(30) Foreign Application Priority Data

Apr. 17, 2020 (KR) ........................ 10-2020-0046858

(51) Int. Cl.
*B22F 3/105* (2006.01)
*G01R 31/28* (2006.01)
(Continued)

(52) U.S. Cl.
CPC ............ *G01R 31/2863* (2013.01); *B22F 1/10* (2022.01); *B22F 3/105* (2013.01); *G01R 1/0441* (2013.01);
(Continued)

(58) Field of Classification Search
None
See application file for complete search history.

(56) References Cited

U.S. PATENT DOCUMENTS

| 2011/0017501 A1* | 1/2011 | Ohmi .................... H05K 1/0373 |
| | | 428/323 |
| 2011/0206933 A1* | 8/2011 | Kim ......................... C08K 3/08 |
| | | 252/75 |

(Continued)

FOREIGN PATENT DOCUMENTS

| JP | 4313297 B2 | 8/2009 |
| KR | 10-2008-0054942 A | 6/2008 |

(Continued)

OTHER PUBLICATIONS

Park, Kwangjae, Jehong Park, and Hansang Kwon. "Effect of intermetallic compound on the Al—Mg composite materials fabricated by mechanical ball milling and spark plasma sintering." Journal of Alloys and Compounds 739 (2018): 311-318. (Year: 2018).*

(Continued)

*Primary Examiner* — Anthony J Zimmer
*Assistant Examiner* — Sean P. O'Keefe
(74) *Attorney, Agent, or Firm* — Knobbe Martens Olson & Bear LLP

(57) ABSTRACT

This application relates to a method of preparing a composite material for a semiconductor test socket, and a composite material prepared through the method. In one embodiment, the method includes preparing a powder mixture including (i) a metal powder comprising aluminum or aluminum alloy particles and magnesium particles and (ii) a polymer powder. The method may also include sintering the powder mixture to produce the composite material using a spark plasma sintering (SPS) process. This application also relates to a method of manufacturing a semiconductor test socket, (Continued)

the method including forming an insulating portion of the semiconductor test socket with the composite material. This application further relates to a semiconductor test socket produced through the method.

6 Claims, 1 Drawing Sheet

(51) Int. Cl.
    *G01R 1/04*         (2006.01)
    *H01R 13/10*       (2006.01)
    *H01R 13/03*       (2006.01)
    *B22F 1/10*         (2022.01)
    *C08L 33/08*       (2006.01)

(52) U.S. Cl.
    CPC ............. *H01R 13/03* (2013.01); *H01R 13/10* (2013.01); *B22F 2003/1051* (2013.01); *B22F 2202/13* (2013.01); *B22F 2301/052* (2013.01); *B22F 2301/058* (2013.01); *B22F 2302/10* (2013.01); *B22F 2302/20* (2013.01); *C08L 33/08* (2013.01)

(56) References Cited

U.S. PATENT DOCUMENTS

| | | | |
|---|---|---|---|
| 2017/0050159 A1* | 2/2017 | Xu | ............................ B01J 2/006 |
| 2021/0008616 A1* | 1/2021 | Kwon | ................... B29C 43/006 |
| 2021/0323059 A1* | 10/2021 | Kwon | ................... C22C 1/0416 |

FOREIGN PATENT DOCUMENTS

| | | | | |
|---|---|---|---|---|
| KR | 10-1515584 B1 | 5/2015 | | |
| KR | 10-2016-01134992 A | 9/2016 | | |
| WO | WO-2014002581 A1 * | 1/2014 | .............. | C08J 5/042 |
| WO | WO-2016063591 A1 * | 4/2016 | ................ | B22F 3/02 |

OTHER PUBLICATIONS

WO-2014002581-A1 English language translation (Year: 2014).*

\* cited by examiner

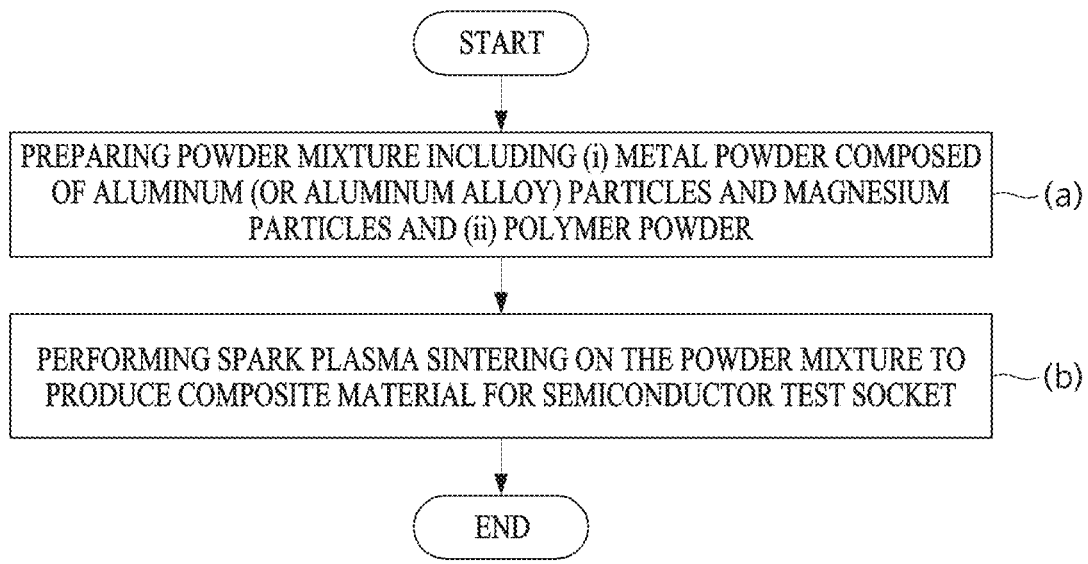

METHOD OF PREPARING COMPOSITE MATERIAL FOR SEMICONDUCTOR TEST SOCKET THAT IS HIGHLY HEAT-DISSIPATIVE AND DURABLE, AND COMPOSITE MATERIAL PREPARED THEREBY

CROSS REFERENCE TO RELATED APPLICATION

The present application claims priority to Korean Patent Application No. 10-2020-0046858, filed Apr. 17, 2020, the entire contents of which is incorporated herein for all purposes by this reference.

BACKGROUND

1. Field

The described technology relates to a method of preparing a heat-dissipative and durable composite material for an insulating portion or an insulating body of a semiconductor test socket and to a composite material prepared thereby.

2. Description of the Related Technology

Integrated circuit (IC) chips that are manufactured through numerous processes are subject to strings of tests such as electrical testing and burn-in testing by which it is determined whether each IC chip is functional or faulty before shipping to customers. For the electrical testing, all of the input and output terminals of each IC chip are connected to a specific test signal generator. The objective of the electrical testing is to check electrical characteristics of each IC chip, such as characteristics of input and output signals, pulse characteristics, operation performance characteristics, noise tolerance, and the like. The subsequent burn-in testing is performed on IC chips that are proven to be functional by the electrical testing. In the burn-in testing, temperature and voltage loads that are respectively higher than a normal operating temperature range and a suitable operating voltage are applied to the functional IC chips for an extended period of time, to timely detect failures in the IC chips.

When IC chips are tested, test equipment for electrical testing and burn-in testing does not directly come into contact with IC chips to be tested. The test equipment and the IC chips to be tested are indirectly connected via intermediate media such as test sockets. Existing test sockets which are expendable parts are made of an insulating polymer-based material or a ceramic material. However, those materials are neither satisfactorily heat-dissipative nor sufficiently durable. Therefore, a new test socket that is highly heat-dissipative and durable is required.

SUMMARY

One objective of the present invention is to provide a method of manufacturing a composite material having enhanced heat-dissipating ability and improved durability, the composite material being suitably used to form an insulating portion or an insulating body of a semiconductor test socket. Another objective of the present invention is to provide a composite material for a semiconductor test socket, the composite material being prepared by the method described above.

In order to accomplish one objective of the present invention, according to one aspect, there is provided a method of preparing a composite material for a semiconductor test socket, the method including: (a) preparing a powder mixture including (i) a metal powder composed of magnesium particles and aluminum or aluminum alloy particles and (ii) a polymer powder; and (b) sintering the powder mixture to produce a composite material using a spark plasma sintering process.

The composite material for a semiconductor test socket, which is prepared according to the preparation method of the present invention, may be a functionally graded composite material. The functionally graded composite material may be prepared by a method including: (a) preparing two or more powder mixtures, each powder mixture including (i) a metal powder composed of magnesium particles and aluminum or aluminum alloy particles and (ii) a polymer powder, in which a content ratio of the polymer powder varies for each powder mixture; (b) preparing a functionally graded laminate by laminating a plurality of powder mixture layers respectively made of the powder mixtures prepared in the step (a), in which a content ratio of the polymer powder with respect to the metal powder varies for each powder mixture layer and gradually changes from the bottom powder mixture layer to the top powder mixture layer; and (c) sintering the functionally graded laminate to produce the functionally graded composite material using a spark plasma sintering process.

In the functionally graded laminate, the content ratio of the polymer powder to the metal powder may gradually increase or decrease from the bottom powder mixture layer to the top powder mixture layer.

In the powder mixture, a volume fraction of the metal powder composed of aluminum or aluminum alloy particles and magnesium particles may range from 14% to 45% and a volume fraction of the polymer powder may range from 55% to 85%.

In the metal powder, the aluminum or aluminum alloy particles and the magnesium particles may be contained at a volume fraction ratio of 1:1.

The polymer powder may be made from polyarylate (PAR).

The polymer powder may further include a ceramic powder.

The ceramic powder is made of one or more compounds selected from the group consisting of $MgO$, $SiO_2$, $Al_2O_3$, $AlN$, $Si_3N_4$.

According to another aspect, there is provided a composite material for a semiconductor test socket, the composite material being prepared by the method described above.

The composite material according to the present invention can replace an insulating silicone rubber that has been used to form an insulating portion of a conventional pressure sensitive conductive rubber-based semiconductor test socket. The composite material according to the present invention can be used as a material for forming an insulating body that supports pogo pins to prevent the pogo pins from being deformed or to protect the pogo pins against external impacts.

The composite material according to the present invention may be functionally graded. The functionally graded composite material may be sheet-shaped and configured such that a volume fraction of the polymer powder or the ceramic powder gradually changes from one side to the other in at least one direction selected from among a thickness direction, a lengthwise direction, and a widthwise direction.

According to a further aspect of the present invention, there is provided a method of manufacturing a semiconductor test socket, the method including a step of forming an insulating portion or an insulating body of a semiconductor test socket with the composite material prepared by the method according to one aspect of the present invention.

According to a yet further aspect, there is provided a semiconductor test socket manufactured through the method according to one aspect of the present invention.

According to the present invention, the composite material for a semiconductor test socket is prepared by performing spark plasma sintering on the powder mixture including the insulating polymer powder and the metal powder composed of aluminum particles and magnesium particles. Therefore, it is possible to obtain a material for a semiconductor test socket that is highly heat-dissipative and durable.

The metal matrix polymer composite material prepared through the method according to the present invention can apply to both pin-type test sockets and silicon rubber-type test sockets. In addition, when a semiconductor test socket is made from the composite material, the semiconductor test socket can be implemented in the form of an integrated body (i.e., single body). That is, it is not necessary to couple an insulating portion or body of a test socket and another element of the test socket using a coupling means such as a bolt and nut. The semiconductor test socket made of the composite material prepared through the method according to the present invention has a good insulating property corresponding to a specific resistivity of $10^{13}$ Ω·m or higher, high thermal conductivity, and good mechanical properties such as high durability. Therefore, the semiconductor test socket according to the present invention provides a longer service life, thereby increasing a replacement cycle of expendable test sockets. This also improves testing efficiency and results in reduction in cost, which improves price competitiveness.

BRIEF DESCRIPTION OF THE DRAWINGS

FIG. 1 is a process flow diagram illustrating a method of preparing a composite material for a semiconductor test socket, according to one embodiment of the present invention.

DETAILED DESCRIPTION

In describing exemplary embodiments of the present invention, well-known functions or constructions will not be described in detail since they may unnecessarily obscure the understanding of the present invention.

Specific embodiments according to the concept of the present invention can be modified and changed in various ways to have various forms. Thus, only some specific embodiments are illustrated and described in the drawings and the description given below. However, it should be understood that all possible embodiments according to the concept of the present invention are not limited only to the specific embodiments disclosed herein but encompass all modifications, equivalents, and substitutes which fall within the spirit and technical scope of the claimed invention.

The terminology used herein is for the purpose of describing specific embodiments only and is not intended to limit the claimed invention. As used herein, the singular forms "a", "an", and "the" are intended to include plural forms as well unless the context clearly indicates otherwise. It will be further understood that the terms "comprises", "includes", or "has" when used in the present disclosure specify the presence of stated features, regions, integers, steps, operations, elements and/or components, but do not preclude the presence or addition of one or more other features, regions, integers, steps, operations, elements, components and/or combinations thereof.

Hereinafter, embodiments of the present invention will be described in detail.

A method of preparing a composite material for a semiconductor test socket, according to one embodiment of the present invention, includes: (a) preparing a powder mixture including (i) a metal powder composed of aluminum or aluminum alloy particles and magnesium particles and (ii) a polymer powder; and (b) sintering the powder mixture prepared in the step (a) using a spark plasma sintering process to produce a composite powder (refer to FIG. 1).

In the step (a), electric ball milling, stirring ball milling, planetary ball milling, or the like is used to uniformly blend the polymer powder and the metal powder composed of aluminum or aluminum alloy particles and magnesium particles. The polymer powder functions to impart insulating property to the composite material. In an exemplary case, the powder mixture is prepared through a low energy milling process in which an electric ball mill is used and the milling is performed at a speed of 100 rpm to 500 rpm for 1 hour to 24 hours.

The aluminum alloy particles included in the metal powder are prepared from any one or more alloys selected from the group consisting of aluminum alloys of 1000 series, 2000 series, 3000 series, 4000 series, 5000 series, 6000 series, 7000 series and 8000.

The polymer powder that is added to impart insulating property to the composite material is a thermoplastic resin or a thermosetting resin.

Examples of the thermoplastic resin include olefin resins (for example, polyethylene, polypropylene, poly-4-methylpentene-1), acrylic resins (for example, methyl polymethacrylate, and acrylonitrile), vinyl resins (for example, polyvinyl chloride, polyvinyl acetate, polyvinyl alcohol, poly Vinyl butyral, and polyvinyl chloride), styrene resins (for example, polystyrene and ABS resin), fluorine resins (for example, tetrafluoroethylene resin, trifluoroethylene resin, polyvinyl fluoride, and polyvinyl fluoride), cellulosic resins (for example, nitrocellulose, cellulose acetate, ethyl cellulose, and propylene cellulose). In addition, polyamide, polyamideimide, polyacetal, polycarbonate, polyethylene butarate, polybutylene butarate, ionomer resin, polysulfone, polyethersulfone, polyphenylene ether, polyphenylene sulfide, polyetherimide, polyether ether ketones, aromatic polyesters (Ekonol and polyarylates), or the like can be used as the thermoplastic resin.

In addition, examples of the thermosetting resin include phenol resin, epoxy resin, and polyimide resin.

The composition of the powder mixture prepared in the step (a) is not particularly limited. The mixing ratio of the metal powder and the polymer powder is selected depending on the physical properties required for a composite material to be used to manufacture a final product (i.e., semiconductor test socket). Preferably, the powder mixture includes 15% to 45% by volume of the metal powder including the aluminum or aluminum alloy particles and magnesium particles and 55% to 85% by volume of the polymer powder.

In addition, the powder mixture can optionally contain a ceramic powder which controls the dielectric constant and/or the mechanical properties of the composite material to be produced. The ceramic powder is prepared from an insulating oxide ceramic material or a non-oxide ceramic material.

Examples of the oxide ceramic material include $Al_2O_3$, $SiO_2$, $TiO_2$, $Y_2O_3$, $ZrO_2$, $Ta_2O_5$, $ThO_2$, $ZrSiO_2$, $BeO$, $CeO_2$, $Cr_2O_3$, $HfO_2$, $La_2O_3$, $MgO$, and $Nb_2O_3$.

The non-oxide ceramic material is selected from among nitrides, carbides, and silicides. Examples of the nitride include AlN, GaN, InN, BN, $Be_3N_2$, $Cr_2N$, HfN, MoN, NbN, $Si_3N_4$, TaN, $Ta_2N$, $Th_2N_3$, TiN, $WN_2$, $W_2N$, VN, and ZrN. Examples of the carbide include $B_4C$, $Cr_3C_2$, HfC, $LaC_2$, $Mo_2C$, $Nb_2C$, SiC, $Ta_2C$, $ThC_3$, TiC, $W_2C$, WC, $V_2C$, and ZrC. Examples of the silicide include $CrSi_2$, $Cr_2Si$, HfSi, $MoSi_2$, $NbSi_2$, $TaSi_2$, $Ta_5Si_3$, $ThSi_2$, $Ti_5Si_3$, $WSi_2$, $W_5Si_3$, $V_3Si$, and $ZrSi_2$.

In the step (b), in order to produce the composite powder for a semiconductor test socket, the powder mixture is subject to spark plasma sintering.

In the spark plasma sintering process, a pulsed direct current is applied to the powder mixture shaped in a specific form under pressure. During the application of the pulsed direct current, sparks occur in the powder mixture due to the pulsed direct current flowing through the powder mixture. The powder mixture is sintered due to heat diffusion and field electric diffusion caused by high energy of spark plasma, heating of a mold induced by an electric resistance, the pressure, and electric energy. Thus, the metal powder and the polymer powder are combined together in a short time, thereby producing a highly compacted composite material. In the method, it is possible to effectively control the growth of grains of the composite material, thereby producing a finely-structured composite material suitable as a material for a semiconductor test socket.

The spark plasma sintering used in the preparation method according to the present invention is performed using a spark plasma sintering apparatus including: a chamber having an internal space to accommodate a mold in which an upper electrode and a lower electrode are provided to generate spark plasma to sinter the powder mixture when current is supplied across the upper and lower electrodes; a cooling unit through which cooling water circulates to cool down the chamber; a current supply unit supplying current across the upper and lower electrodes; a temperature sensor configured to detect the temperature of the chamber; a pump configured to purge inside air from the chamber; a pressure unit to increase the internal pressure of the chamber; a controller to adjust a process temperature for spark plasma sintering according to the temperature detected by the temperature sensor; and a control board with which settings for the controller are made.

The pump of the spark plasma apparatus is operated to purge the inside of the chamber until the inside of the chamber enters a vacuum state. Through this purging, impurities in the chamber are completely removed. Therefore, the plasma spark sintering can be performed without causing oxidation.

The powder mixture is preheated to a predetermined sintering temperature at a predetermined heating rate, and then the spark plasma sintering is performed. Since the entire powder mixture in the chamber is uniformly heated through the preheating, it is possible to produce a homogeneous composite material.

In addition, since it is possible to inhibit the growth of grains of the composite material by adjusting the heating rate, it is possible to produce a composite material having a suitable grain size for a semiconductor test socket.

For example, in the case of preparing a composite material using a mixed powder containing a polymer powder and a metal powder composed of aluminum or aluminum alloy particles and magnesium particles, the spark plasma sintering is performed at a temperature of 200° C. to 400° C. under a pressure of 100 MPa to 1.5 GPa for a period of 1 minute to 10 minutes. With these conditions, it is possible to produce a composite material for a semiconductor test socket.

In addition, the preparation method can optionally include a cooling step performed after the sintering. With this cooling step, it is possible to improve the mechanical properties of the composite material so as to be more suitably used to manufacture a semiconductor test socket. During the cooling step, a predetermined pressure is maintained to suppress formation of voids on the surface of or in the composite material.

According to the present invention, in the above-described preparation method of a composite material for a semiconductor test socket, a powder mixture containing a polymer powder and a metal powder composed of aluminum and magnesium is subject to a spark plasma sintering process to produce a composite material for a semiconductor test socket. Therefore, it is possible to obtain a semiconductor test socket that is highly heat-dissipative and durable with the use of the composite material prepared through the method of the present invention.

In addition, the metal-polymer composite material prepared through the method according to the present invention can be applied to both the pogo-pin type and the silicone rubber type. When a semiconductor test socket is made of the metal-polymer composite material prepared through the method according to the present invention, the semiconductor test socket provides the advantages of high electric insulating property, high thermal conductivity, and good mechanical properties such as high strength. Therefore, the service life of the semiconductor test socket is increased compared to conventional semiconductor test sockets. As a result, a replacement cycle of semiconductor test sockets that are expendable parts is increased, resulting in an increase in testing efficiency and an improvement in price competitiveness.

Hereinafter, the present invention will be described in more detail with reference to examples.

The examples disclosed herein may be modified in various other forms, and the scope of the present invention should not be interpreted to be limited to the examples described below. The examples of the present invention are provided to more fully and thoroughly convey the concept of the present invention to those skilled in the art.

EXAMPLE

A composite material for a semiconductor test socket was prepared by obtaining a powder mixture containing a polymer powder and a metal powder composed of aluminum particles and magnesium particles and performing spark plasma sintering on the obtained powder mixture.

The metal powder was an aluminum-magnesium mixed powder in which a volume fraction of each of aluminum and magnesium was 50% by volume. The polymer powder was made of polyarylate (PAR) resin.

The polyarylate resin means aromatic linear polyester resin which is a plastic engineering resin with special properties. Since polyarylate resin is highly heat-resistive, mechanically strong, and transparent, it is used to manufacture switches of electronic components, sockets, parts of microwave ovens, casings of relays, substrates, and the like. In addition, in the field of machinery, polyarylate resin is widely used as a packaging material or a material for various articles such as interior/exterior products for watches, optical machinery parts, heating device parts such as gas circuit breakers, lenses and housings for automobiles, automotive parts, and instrument panels. The polyarylate resin as described above is usually prepared by condensation polymerization of an aromatic diol and an aromatic dicarboxylic acid.

First, AlSium powder and PAR powder were charged into a plurality of stainless steel vials in which a volume fraction ratio of the AlSium powder and the PAR powder varies from vial to vial. The volume fraction ratios for the respective vials were 20:80, 25:75, 30:70, 35:65, and 40:60. Then, 20 mL heptane was introduced into each of the vials. Stainless steel balls with a diameter of 10 mm are added. A weight ratio of the stainless steel balls and the powder mixture was 5:1. Next, low-energy ball milling was performed at a speed of 160 rpm for 24 hours. Thus, five metal-polymer powder mixtures that differ in volume fraction ratio of the metal powder and the polymer powder were prepared. That is, AlSium-60 vol. % PAR, AlSium-65 vol. % PAR, AlSium-70 vol. % PAR, AlSium-75 vol. % PAR, and AlSium-80 vol. % PAR were prepared.

Next, the metal-polymer powder mixture was poured into a tungsten carbide alloy (WC—Co) mold coated with boron nitride (BN) and heated to a sintering temperature of 350° C. at a heating rate of 50° C. per minute. Spark plasma sintering was performed at 350° C. under a pressure of 1 GPa for 5 minutes to produce a composite material for a semiconductor test socket. Next, a semiconductor test socket with an insulating body made of the composite was manufactured.

Specific embodiments and examples of the present invention have been described above with reference to the accompanying drawings, but those ordinarily skilled in the art will appreciate that the present invention can be implemented in other forms without departing from the technical spirit or essential features of the present invention. Therefore, it should be understood that the embodiments and examples described above are illustrative in all respects and are not restrictive.

What is claimed is:

1. A method of preparing a composite material for a semiconductor test socket, the method comprising:
    preparing two or more powder mixtures, each powder mixture including: (i) a metal powder comprising magnesium particles and aluminum or aluminum alloy particles, and (ii) a polymer powder, wherein a fraction ratio of the polymer in each of the powder mixtures differs;
    preparing a functionally graded laminate by sequentially laminating a plurality of powder mixture layers, wherein a content ratio of the polymer powder with respect to the metal powder gradually varies from a bottom powder mixture layer to a top powder mixture layer; and
    sintering the functionally graded laminate to produce a functionally graded composite material using a spark plasma sintering process.

2. The method according to claim 1, wherein the powder mixtures further include a ceramic powder.

3. The method according to claim 2, wherein the ceramic powder is made from one or more compounds selected from the group consisting of $MgO$, $SiO_2$, $Al_2O_3$, $AlN$, $Si_3N_4$.

4. The method of claim 1, wherein the spark plasma sintering process is performed under a pressure in a range of 100 MPa to 1.5 GPa.

5. The method of claim 1, wherein the spark sintering process is performed under a pressure in a range of 1 GPa to 1.5 GPa.

6. A method of manufacturing a semiconductor test socket, the method comprising:
    preparing two or more powder mixtures, each powder mixture including: (i) a metal powder comprising magnesium particles and aluminum or aluminum alloy particles, and (ii) a polymer powder, wherein a fraction ratio of the polymer in each of the powder mixtures differs;
    preparing a functionally graded laminate by sequentially laminating a plurality of powder mixture layers, wherein a content ratio of the polymer powder with respect to the metal powder gradually varies from a bottom powder mixture layer to a top powder mixture layer;
    sintering the functionally graded laminate to produce a functionally graded composite material using a spark plasma sintering process; and
    forming an insulating portion of the semiconductor test socket with the functionally graded composite material.

* * * * *